United States Patent
Ma et al.

(10) Patent No.: US 8,420,488 B2
(45) Date of Patent: Apr. 16, 2013

(54) METHOD OF FABRICATING HIGH VOLTAGE DEVICE

(75) Inventors: Yun-Han Ma, Taipei (TW);
Ming-Tsung Lee, Yilan County (TW);
Shih-Ming Liang, Hsinchu County (TW); Hwi-Huang Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 801 days.

(21) Appl. No.: 11/853,499

(22) Filed: Sep. 11, 2007

(65) Prior Publication Data

US 2009/0065879 A1    Mar. 12, 2009

(51) Int. Cl.
*H01L 21/336* (2006.01)

(52) U.S. Cl.
USPC .................. 438/287; 438/591; 257/635

(58) Field of Classification Search ............ 438/199, 438/287, 591; 257/324
See application file for complete search history.

(56) References Cited

U.S. PATENT DOCUMENTS

| | | | |
|---|---|---|---|
| 5,926,729 A | | 7/1999 | Tsai et al. |
| 5,940,736 A | * | 8/1999 | Brady et al. ............... 438/787 |
| 5,960,289 A | * | 9/1999 | Tsui et al. ................. 438/275 |
| 6,403,425 B1 | | 6/2002 | Ang et al. |
| 6,624,044 B2 | * | 9/2003 | Ito et al. .................... 438/425 |
| 6,737,342 B1 | * | 5/2004 | Lee et al. ................... 438/591 |
| 6,740,944 B1 | | 5/2004 | McElheny et al. |
| 2002/0022340 A1 | * | 2/2002 | Lin et al. ................... 438/435 |
| 2005/0104098 A1 | * | 5/2005 | Yasuoka et al. ........... 257/288 |
| 2006/0240628 A1 | * | 10/2006 | Chen .......................... 438/299 |

FOREIGN PATENT DOCUMENTS

CN      1697181 A      11/2005

OTHER PUBLICATIONS

Article titled "Hot-carrier degradation of submicrometer p-MOSFETs with thermal/LPCVD composite oxide" jointly authored by Lee et al., IEEE translation on Electron Devices, vol. 40, No. 1, pp. 163-168, Jan. 1993.
Chinese First Examination Report of China Application No. 2007101529012, dated Jul. 31, 2009.

* cited by examiner

*Primary Examiner* — Jenny L Wagner
*Assistant Examiner* — Mark Tornow
(74) *Attorney, Agent, or Firm* — WPAT PC; Justin King

(57) ABSTRACT

A high voltage device is provided. The high voltage device includes a gate on a substrate, two source/drain regions in the substrate beside the gate, and a composite gate dielectric layer that includes at least two stacked continuous layers, extending from one side to another side of the gate. Wherein, the at least two stacked continuous layers is a combination of at least one thermal oxide layer and at least one chemical vapor deposited layer.

15 Claims, 4 Drawing Sheets

METHOD OF FABRICATING HIGH VOLTAGE DEVICE

BACKGROUND OF THE INVENTION

1. Field of Invention

The present invention relates to an integrated circuit and a method of fabricating the same; more particularly, the present invention relates to a high voltage device that has a pad oxide with a uniform thickness and a method of fabricating the same.

2. Description of Related Art

Metal oxide semiconductor transistor device is the most fundamental unit in a semiconductor device. A typical metal oxide semiconductor transistor includes a gate, a gate oxide layer and source/drain regions. The gate is configured on a substrate, using a gate oxide layer for insulating from the substrate. The source/drain regions are doped regions having the same types of dopants and are configured in the substrate beside two sides of the gate.

A typical method in forming the gate oxide layer is via performing a thermal oxidation process, in which the substrate surface is exposed to oxygen ambient and a silicon oxide layer is formed thereon. However, the oxidation rate at the substrate surface varies. Hence, the thickness of the resulting silicon oxide layer becomes non-uniform. More particularly, the thermal oxidation rate at the substrate surface of the center area of the active region is higher, while the thermal oxidation rate at the substrate surface of the border between the active region and the isolation structure, especially at the corner of the isolation structure, is lower due to their physical structures. Hence, the resulting oxide layer is thicker at the center of the active region and is thinner at the periphery of the active region. For a high voltage device, for example, for a high voltage device of a fully depeleted metal oxide semiconductor transistor (FDMOS), the target thickness of the gate oxide layer is large. Therefore, differentiation in the thickness between the center and the periphery of the active region becomes even more significant. During the period when high voltage is being applied to the gate, a thin gate oxide layer easily induces a breakdown, especially a time-dependent dielectric breakdown (TDDB). Ultimately, the reliability of the device is seriously affected.

SUMMARY OF THE INVENTION

The present invention is to provide a high voltage device and a method of fabricating the same, wherein the gate dielectric layer of the high voltage device has a uniform thickness for mitigating the time-dependent dielectric breakdown characteristic and for improving the reliability of the device.

The present invention is to provide a high voltage device, which includes a gate, two source/drain regions and a composite gate dielectric layer. The gate is disposed on a substrate. The two source/drain regions are respectively configured in the substrate beside two sides of the gate. The composite gate dielectric layer is disposed between the gate and the substrate, wherein the composite gate dielectric layer includes at least two stacked continuous layers, extending from one side of the gate to the other side.

According to an embodiment of the present invention, in the above high voltage device, the two continuous layers include a thermal oxide layer and a deposited layer formed by chemical vapor deposition, for example. The thermal oxide layer is disposed on a substrate, and the chemical vapor deposited layer is disposed on and in contact with the thermal oxide layer.

According to an embodiment of the present invention, in the above high voltage device, the chemical vapor deposited layer includes a silicon oxide layer formed by using tetraethyl orthosilicate (TEOS) as a reactant gas.

According to an embodiment of the present invention, in the above high voltage device, the chemical vapor deposited layer includes a high temperature oxide layer.

According to an embodiment of the present invention, in the above high voltage device, a ratio in the thickness of the thermal oxide layer to the chemical vapor deposited layer is between about 1:0.5 and about 1:1.5.

According to an embodiment of the present invention, in the above high voltage device, the high voltage device includes two isolation structures, respectively configured in the substrate between the gate and the two source/drain regions.

According to an embodiment of the present invention, in the above high voltage device, the chemical vapor deposited layer extends to con a portion of the two isolation structures.

According to an embodiment of the present invention, in the above high voltage device, the at least two stacked continuous layers are constituted with a single thermal oxide layer and a single chemical vapor deposited layer.

According to an embodiment of the present invention, in the above high voltage device, the at least two stacked continuous layers are constituted with multiple layers thermal oxide layer and a single chemical vapor deposited layer.

According to an embodiment of the present invention, in the above high voltage device, the at least two stacked continuous layers are constituted with multiple layers of thermal oxide layer and multiple layers of chemical vapor deposited layer.

According to an embodiment of the present invention, in the above high voltage device, the at least two stacked continuous layers are constituted with a single thermal oxide layer and multiple layers of chemical vapor deposited layer.

The present invention provides a method of fabricating a high voltage device. The method includes forming a composite dielectric layer that includes at least two stacked continuous layer. A gate is then formed on the composite dielectric layer. Thereafter, source/drain regions are respectively formed in the substrate beside two sides of the gate.

According to an embodiment of the method of fabricating a high voltage device of the present invention, forming the composite dielectric layer includes forming a thermal oxide layer on the substrate. Thereafter, forming a chemical vapor deposited layer on the thermal oxide layer.

According to an embodiment of the method of fabricating a high voltage device of the present invention, subsequent to forming the chemical vapor deposited layer, a thermal annealing process is performed.

According to an embodiment of the method of fabricating a high voltage device of the present invention, the thermal annealing process is performed in a furnace.

According to an embodiment of the method of fabricating a high voltage device of the present invention, the thermal annealing process is performed at a temperature of about 1150±50 degrees Celsius.

According to an embodiment of the method of fabricating a high voltage device of the present invention, the thermal annealing process is performed for a period of about 30±5 minutes.

According to an embodiment of the method of fabricating a high voltage device of the present invention, the thermal oxide layer and the chemical vapor deposited layer are formed by forming a patterned mask layer on a substrate, wherein the patterned mask layer has an opening that exposes the substrate. Thereafter, a thermal oxidation process is performed to grow the thermal oxide layer on the substrate that is exposed by the opening. Thereafter, a chemical vapor deposition process is performed to form a deposited material layer on the patterned mask layer and the thermal oxide layer. A patterned photoresist layer is subsequently formed on the substrate, covering the deposited material layer that covers the thermal oxide layer. The deposited material layer that is not covered by the patterned photoresist layer is further removed, leaving behind the deposited material layer to form the chemical vapor deposited layer. The patterned photoresist layer and the patterned mask layer are ultimately removed.

According to an embodiment of the method of fabricating a high voltage device of the present invention, forming the patterned mask layer includes sequentially forming a pad oxide layer and a silicon nitride layer on the substrate.

According to an embodiment of the method of fabricating a high voltage device of the present invention, the chemical vapor deposited layer includes a silicon oxide layer formed by using tetraethyl orthosilicate (TEOS) as a reactant gas.

According to an embodiment of the method of fabricating a high voltage device of the present invention, the chemical vapor deposited layer includes a high temperature oxide layer.

According to an embodiment of the method of fabricating a high voltage device of the present invention, a ratio in the thickness of the thermal oxide layer to the chemical vapor deposited layer is between about 1:0.5 and about 1:1.5.

According to an embodiment of the method of fabricating a high voltage device of the present invention, before forming the composite dielectric layer, two isolation structures are formed in the substrate, and the composite dielectric layer is formed on the substrate between the interior sides of the two isolation structures, while the two source/drain regions are formed in the substrate at the exterior sides of the two isolation structures.

According to an embodiment of the method of fabricating a high voltage device of the present invention, the method in forming the at least two stacked continuous layer includes forming a single thermal oxide layer, followed by forming a single chemical vapor deposited layer on the single thermal oxide layer.

According to an embodiment of the method of fabricating a high voltage device of the present invention, the method in forming the at least two stacked continuous layer includes forming multiple layers of thermal oxide layer, followed by forming a single chemical vapor deposited layer on the multiple layers of the thermal oxide layer.

According to an embodiment of the method of fabricating a high voltage device of the present invention, the method in forming the at least two stacked continuous layer includes forming multiple layers of thermal oxide layer, followed by forming multiple layers of chemical vapor deposited layer on the multiple layers of the thermal oxide layer.

According to an embodiment of the method of fabricating a high voltage device of the present invention, the method in forming the at least two stacked continuous layer includes forming a single thermal oxide layer, followed by forming multiple layers of chemical vapor deposited layer on the single thermal oxide layer.

According to an embodiment of the method of fabricating a high voltage device of the present invention, the gate dielectric layer has uniform thickness. Hence, the breakdown characteristic of the device is improved to further enhance the reliability of the device.

In order to make the aforementioned and other objects, features and advantages of the present invention comprehensible, a preferred embodiment accompanied with figures is described in detail below.

DESCRIPTION OF EMBODIMENTS

Figure 1A:
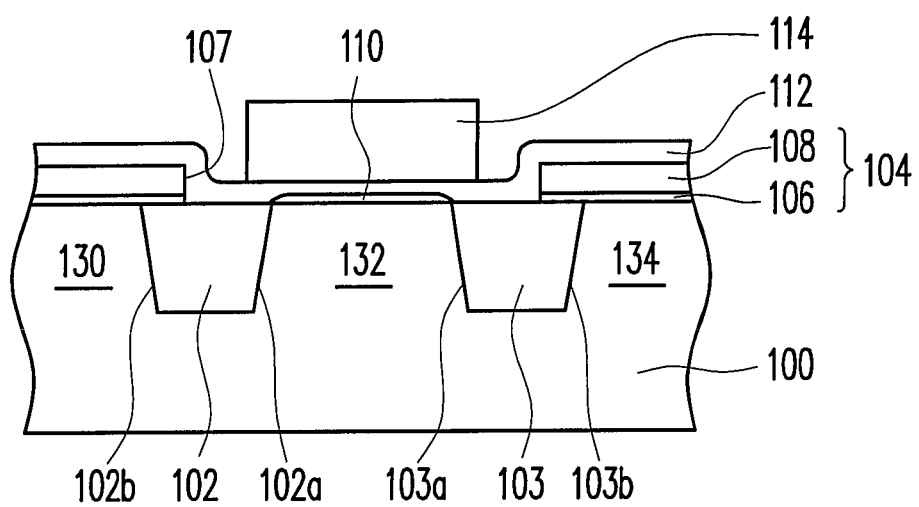
FIGS. 1A to 1C are schematic, cross-sectional views showing selected steps for the fabrication of a high voltage semiconductor transistor according to an embodiment of the present invention.
Figure 1B:
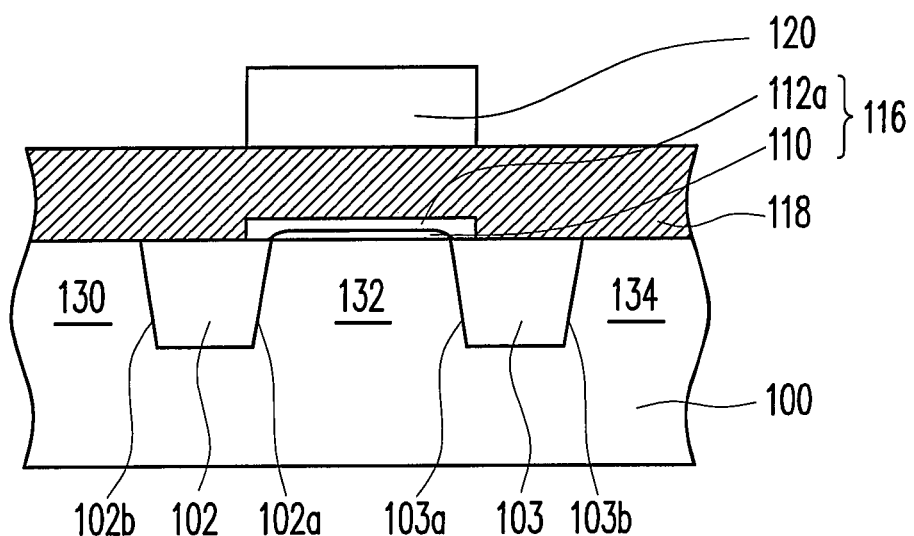
Figure 1C:
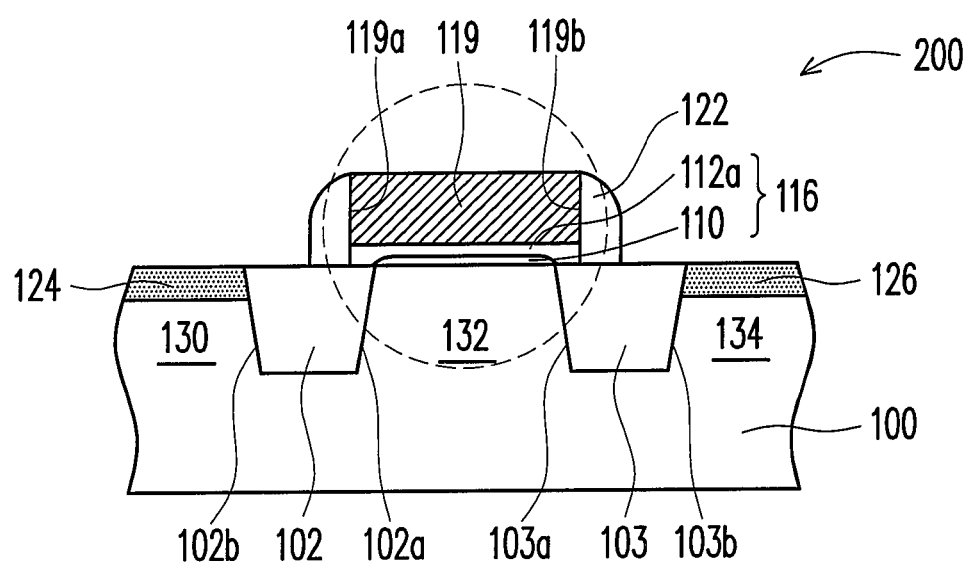

FIGS. 1A to 1C are schematic, cross-sectional views showing selected steps for the fabrication of a high voltage semiconductor transistor according to an embodiment of the present invention.

Referring to FIG. 1A, a substrate 100 is provided, wherein a material constituting the substrate 100 includes semiconductor such as silicon or silicon-on-insulator (SOI). In one embodiment, the substrate 100 includes silicon with P type dopants. In one embodiment, a well region (not shown), such as N-type well and/or P-type well, is further formed in the substrate 100. Isolation structures 102, 103 are formed in the substrate 100 to define the active regions 130, 132, 134. Isolation structures 102, 103 are formed by, for example, shallow trench isolation (STI) method.

A patterned mask layer 104 is then formed on the substrate 100, wherein the patterned mask layer 104 has an opening 107 that exposes the surface of the active region between interior sides 102a, 103a of the isolation structures 102, 103 and portions of the isolation structures 102, 103. In one embodiment, the patterned mask layer 104 is formed by forming sequentially a pad oxide layer 106 and a silicon nitride layer 108 on a substrate 100, followed by performing a lithograph process to pattern the pad oxide layer 106 and the silicon nitride layer 108. The pad oxide layer 106 is formed by performing thermal oxidation, for example. The silicon nitride layer 108 is formed by methods include but not limited to chemical vapor deposition, and is formed with a thickness of about 160 angstroms, for example.

Thereafter, a thermal oxidation process is performed to grow a thermal oxide layer 110 on the part of the substrate 100, exposed by the opening 107 of the patterned mask layer 104. In one embodiment, the thermal oxidation process is performed in a furnace. The thermal oxidation process is conducted for a duration of about 60±15 by introducing gases such as oxygen and an oxygen-containing gas into the furnace as reactant gases, controlling the furnace temperature at about 850±40 degrees Celsius. The thermal oxide layer 110 has a thickness of about xxxx angstroms to xxxx angstroms.

Thereafter, a chemical vapor deposition process is performed to form a chemical vapor deposited material layer 112 on the thermal oxide layer 110 exposed by the opening 107 and the patterned mask layer 104. The material constituting the chemical vapor deposited material layer 112 and that of the thermal oxide layer 110 may be the same or different, such as silicon oxide. In one embodiment, the ratio in the thickness of the thermal oxide layer 110 to the chemical vapor deposited material layer 112 is about 1:0.5 to 1:1.5. The total thickness of thermal oxide layer 110 and the chemical vapor deposited material layer 112 is related to the voltage being applied to the high voltage device. In a 32-volts FDMOS high voltage device, the total thickness of the thermal oxide layer 110 and the chemical vapor deposited material layer 112 is about 850 angstroms.

In one embodiment, the deposited material layer 112 is a TEOS oxide layer formed by using tetraethyl orthosilicate (TEOS) as a reactant gas. The TEOS oxide layer is formed by performing a low pressure chemical vapor deposition process. The flow rate of TEOS is about 100 to 250 sccm. Further, the deposition is conducted for about 8 to 20 minutes at a temperature of about 680±30 degrees Celsius and under a pressure of about 200 torrs to about 1000 torrs.

In another embodiment, the chemical vapor deposited material layer 112 is a high temperature oxide layer (HTO). The high temperature oxide material layer 112 is formed by low pressure-CVD process, for example. The high temperature oxide material layer 112 is formed by, for example using $N_2O$ and $SiH_2Cl_2$ as reactant gases, wherein the flow rates of $N_2O$ and $SiH_2Cl_2$ are respectively at 100 to 200 sccm and 100 to 200 sccm. Further, the high temperature oxide material layer is formed at a temperature of about 800±60 degrees Celsius and under a pressure of 200 to 600 torrs for a period of about 1 hour to 2.5 hours.

The thermal oxide layer 110 formed by a thermal oxidation process has excellent properties. However, it is difficult to grow silicon oxide at the border of the active region 132; hence, the thickness of the oxide layer at the border of the active region 132 is thinner than that at the center. Ultimately, the uniformity of the oxide layer is undesirable. However, by using the subsequent chemical vapor deposition process to deposit the chemical vapor deposited material layer 112 with better uniformity, the thickness variation between the center and the peripheral of the active region can be mitigated. Although the properties of the chemical vapor deposited material layer is less favorable than those formed by thermal oxidation, the properties of the chemical vapor deposited material layer can be improved by performing a thermal annealing process.

Thereafter, a patterned photoresist layer 114 is formed on the chemical vapor deposited material layer 112. The photoresist layer 114 covers the active region 132 and portions of the isolation structures 102, 103.

Referring to FIG. 1B, an etching process is performed to remove the chemical vapor deposited material layer 112 not covered by the photoresist layer 114, leaving behind the chemical vapor deposited material layer 112a. The two continuous layers of the chemical vapor deposited layer 112a and the thermal oxide layer 110 formed a composite gate dielectric layer 116. The etching process includes but not limited to a wet etching process. In one embodiment, the material of the CVD material layer 112a is silicon oxide, the wet etching process is performed using a dilute hydrofluoric acid solution as an etching solution, for example, diluting hydrofluoric acid 100 times with deionized water (hydrofluoric acid:water=1:100). The etching time is related to the thickness of the CVD material layer 112a, for example about 260 seconds.

The patterned photoresist layer 114 is then removed. Removing the patterned photoresist layer 114 may accomplished by wet etching, for example, performing 600 seconds with CAROZ. The patterned mask layer 104 is further removed, for example, by performing an isotropic etching process such as a wet etching process. In one embodiment, the patterned mask layer 104 is formed with a silicon nitride 108 layer and a pad oxide layer 106. Removing the patterned mask layer 104 may achieve by performing an etching process for about 350 seconds, employing hot phosphoric acid as an etchant.

Subsequent to the removal of the patterned mask layer 104, the composite gate dielectric layer 116 above the substrate 100 between the interior sides of the isolation structures 102, 103 is exposed. Before performing the next process step, a cleaning process may perform to remove particles on the substrate 100. The cleaning process may perform for about 300 seconds using a solvent containing ammonium hydroxide and hydrogen peroxide.

To improve the qualities of the CVD material layer 112a in the composite gate dielectric layer 116, after the cleaning process, a thermal annealing process may perform to densify the CVD material layer 112a. In one embodiment, the thermal annealing process is performed for about 30±5 minutes in a furnace maintained at about 1150±50 degrees Celsius. Subsequent to a treatment of thermal annealing, the density of the CVD material layer 112a is significantly increased to reduce the trapping of electrons and holes. Hence, the quality of the device is greatly improved.

Thereafter, a conductive layer 118 is formed on the substrate 100. The conductive layer 118 is constituted mainly with a silicon material, such as, doped silicon, undoped silicon, doped polysilicon or undoped polysilicon. When the material of the conductive layer 118 is doped silicon or doped polysilicon, the dopants may be N type dopants or P type dopants. A patterned photoresist layer 120 is further formed on the conductive layer 118.

Continuing to FIG. 1C, using the patterned photoresist layer 120 as a mask, the conductive layer 118 not covered by the patterned photoresist layer 120 is etched to form a gate electrode 119. The etching of the conductive layer 118 is accomplished by anisotropic etching, for example, dry etching, such as plasma etching. The sidewall of the gate electrode 119 is further formed with a spacer 122. The spacer 122 is constituted with a material including but not limited to silicon oxide or silicon nitride. The spacer 122 can be a single layer spacer or a double layer spacer or a multi-layer spacer. The spacer 122 is not limited to any particular shape. Doped regions 124, 126 are formed in the substrate 100 at the exterior sides 102b, 103b of the isolation structures 102, 103 to form source/drain regions. The doped regions 124, 126 are formed by ion implantation. The implanted dopants include N-type dopants or P type dopants. The N-type dopants include but not limited to phosphorous or arsenic, while the P-type dopants include but not limited to boron.

In accordance to the fabrication method of the embodiment of the present invention, after being subjected to an annealing treatment, the structure of the composite gate dielectric layer 116 becomes very dense and the rate of erosion is thereby lower. Further, the composite dielectric layer 116 extends to con the isolation structures 102, 103. The composite dielectric layer 116 has sufficient thickness at the border between the active region 132 and the isolation structures 102, 103. Therefore, during the etching process or the cleaning process, the chance of erosion is minimized and the electrical performance of the device is unaffected.

Referring to FIG. 1C, the high voltage device according to an embodiment of the present invention, for example, a fully depleted metal oxide semiconductor transistor, includes a gate electrode 119, two source/drain regions 124, 126, a composite gate dielectric layer 116 and two isolation structures 102, 103. The two isolation structures 102, 103 are configured in the substrate 100. The gate electrode 119 is disposed on the substrate at the interior sides 102a, 103a of the two isolation structures 102, 103. Two source/drain regions 124, 126 are configured in the substrate 100 respectively at the exterior sides 102b, 103b of the isolation structures of the two sides of the gate electrode 119. The dopants of the source/drain regions 124, 126 include N-type dopants or P-type dopants. The N-type dopants include but not limited to phosphorous or arsenic, while the P-type dopants include but not limited to boron. The composite gate dielectric layer 116 is configured between the gate electrode 119 and the substrate 100, extending from one side 119*a* of the gate electrode 119 to another side 119*b*. The composite gate dielectric layer 116 includes at least two stacked continuous layers 110, 112*a*. The continuous layer 110 is disposed on the substrate 100. In one embodiment, the continuous layer 110 is a thermal oxide layer, which extends from the interior side 102*a* of the isolation structure 102 to the interior side 103*a* of the isolation structure 103. The continuous layer 112*a* is disposed on the continuous layer 110. In one embodiment, the continuous layer 112*a* is a CVD material layer, which covers not only the continuous layer 110, but extends to parts of the two isolation structures 102, 103. In one embodiment, the ratio in thickness of the continuous layers 110, 112*a* is between about 1:0.5 and 1:1.5. In one embodiment, the sidewall of the gate electrode 119 further includes a spacer 122.

Although the disclosure herein refers to certain illustrated embodiments of a composite gate dielectric layer formed by a single layer of the thermal oxide layer and the single layer of the CVD layer, it is to be understood that these embodiments are presented by way of example and not by way of limitation. For example, it is understood by a person of ordinary skill practicing this invention that the composite gate dielectric layer may include, according to the practical requirements, multiple layers of the thermal oxide layer or multiple layers of the CVD layers. Further, each layer of the CVD deposited layers may form with similar or different methods, for example, each CVD layer may be a TEOS or HTO layer or other material layer.

Figure 2:
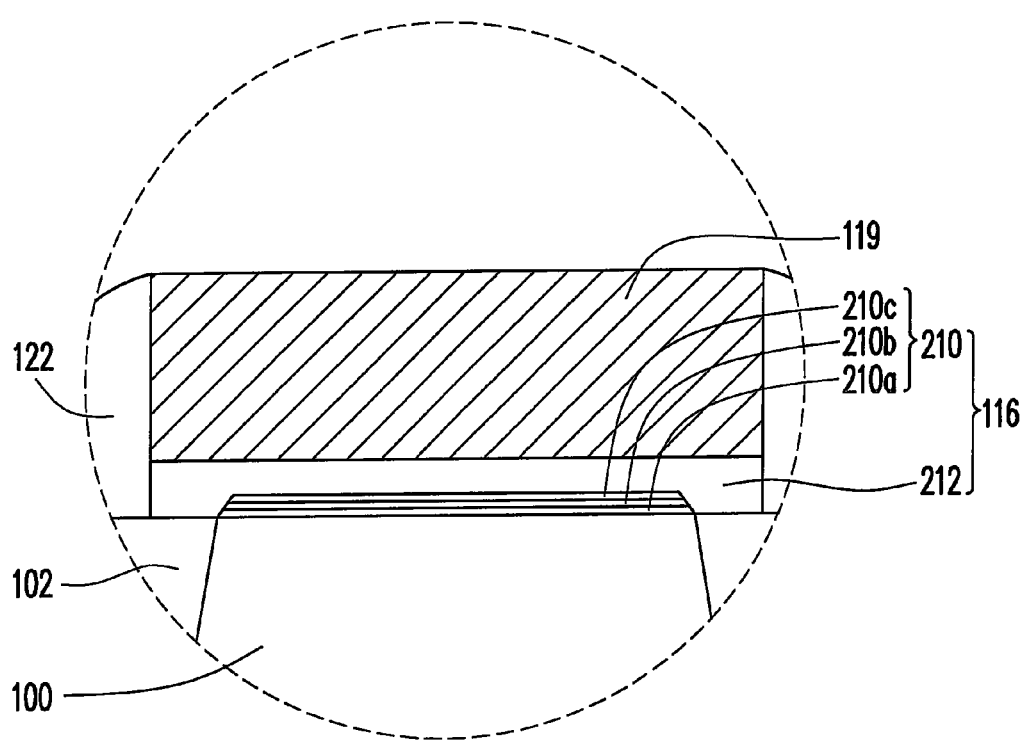
FIGS. 2 to 4 are regional enlarged diagrams respectively illustrating the high voltage device having different composite gate dielectric layers.
Figure 3:
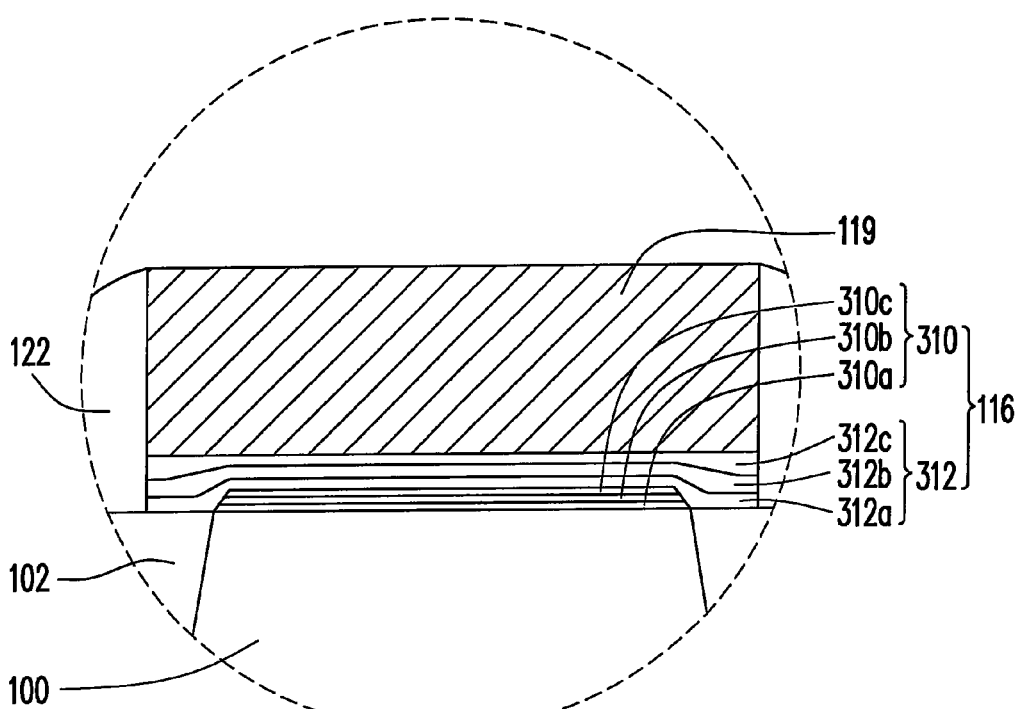
Figure 4:
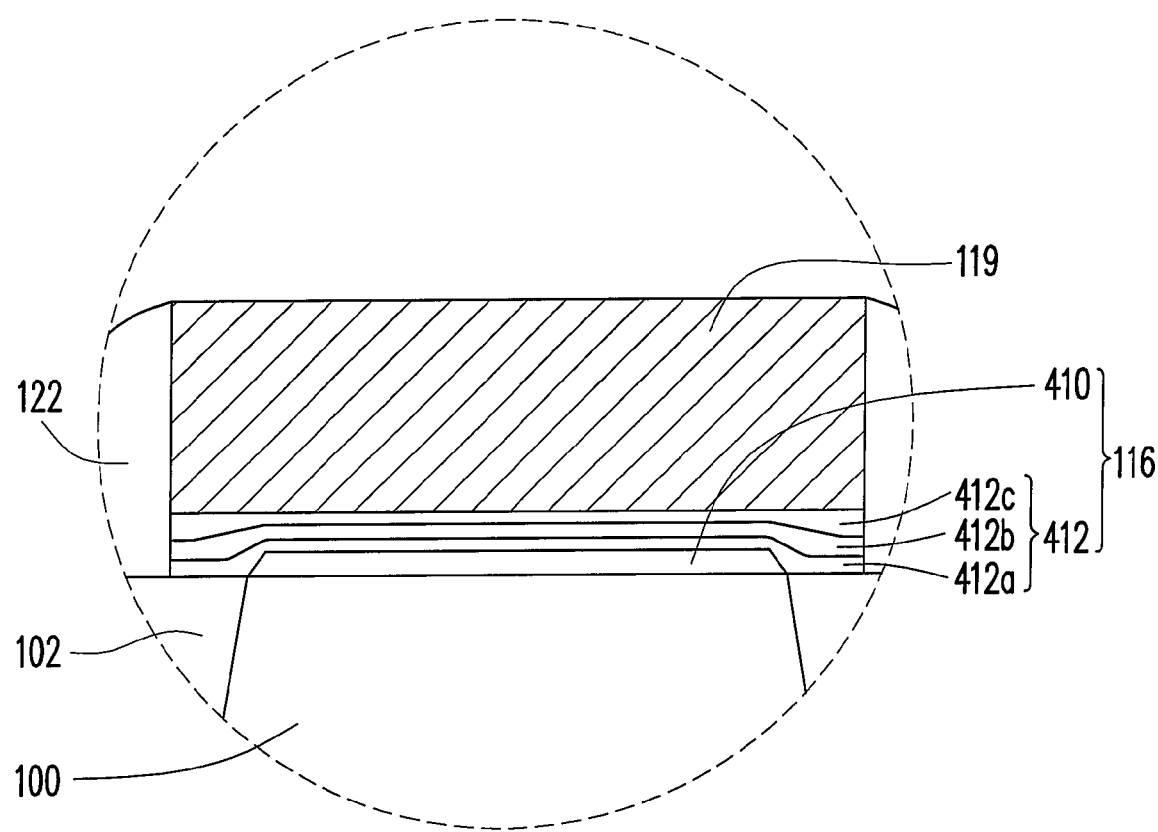

FIGS. 2 to 4 are regional enlargement diagrams respectively illustrating the high voltage device having different composite gate dielectric layers.

Referring to FIG. 2, in one embodiment, the composite gate dielectric layer 116 is constituted with a stacked thermal oxide layer 210 and a single CVD 212 layer. In one embodiment, the thickness ratio of the stacked thermal oxide layer 210 and the CVD layer 212 is about 1:0.5 to 1:1.5. The stacked thermal oxide layer 210 is a multiple layer of thermal oxide layers, for example two layers or more than two layers of the thermal oxide layer. The stacked thermal oxide layer 210 in FIG. 2 is constituted with the thermal oxide layers 210*a*, 210*b*, 210*c*. However, it should not be construed as limiting the scope of the invention. It should be appreciated that, according to practical requirements, the stacked thermal oxide layer 210 may constitute with two layers or more than three layers of the thermal oxide layer. The thermal oxide layers 210*a*, 210*b*, 210*c* are formed by performing a thermal oxidation process, for example, in a same furnace under different temperatures or the different flow rates of the reactant gases. The thicknesses of the thermal oxide layers 210*a*, 210*b*, 210*c* may be the same or different. The material of the CVD layer 212 and that of the thermal oxide layer 210 may be the same or different. For example, their materials may include silicon oxide. The CVD layer 212 may be a TEOS oxide layer of a HTO layer, formed by the above methods.

Referring to FIG. 3, in one embodiment, the composite gate dielectric layer 116 is constituted with a stacked thermal oxide layer 310 and a stacked CVD layer 312. In one embodiment, the thickness ratio of the stacked thermal oxide layer 310 and the stacked CVD layer 312 is about 1:0.5 to 1:1.5. The stacked thermal oxide layer 310 is a multiple layer of the thermal oxide layer, for example, two layers or more than two layers. The stacked thermal oxide layer 310 in FIG. 3 is constituted with the thermal oxide layers 310*a*, 310*b*, 310*c*. However, it should not be construed as limiting the scope of the invention. It should be appreciated that, according to practical requirements, the stacked thermal oxide layer 310 may constitute with three layers or more than three layers of the thermal oxide layer. The thermal oxide layers 310*a*, 310*b*, 310*c* are formed by performing a thermal oxidation process, for example, in a same furnace under different temperatures or the different flow rates of the reactant gases. The thicknesses of the thermal oxide layers 310*a*, 310*b*, 310*c* may be the same or different.

The material of the CVD layer 312 and that of the thermal oxide layer 310 may be the same or different. For example, their materials may include silicon oxide. The stacked CVD layer 312 is constituted with a multiple layer of the CVD layer, for example two or more than two layers. The stacked CVD layer 312 in FIG. 3 is constituted with the CVD layers 312*a*, 312*b*, 312*c*. However, it should not be construed as limiting the scope of the invention. It should be appreciated that, according to practical requirements, the stacked CVD layer 312 may constitute with three layers or more than three layers of the CVD layer. Each CVD layer 312*a*, 312*b*, 312*c* may form by the same or different methods. For example, each CVD layer 312*a*, 312*b*, 312*c* may be a TEOS oxide layer or a HTO layer. The methods in forming the TEOS oxide layer or the HTO layer are described above and will not be reiterated herein. Further, the thicknesses of the deposited layer 312*a*, 312*b*, 312*c* may be the same or different.

Referring to FIG. 4, in another embodiment, the composite gate dielectric layer 116 is constituted with a thermal oxide layer 410 and a stacked CVD layer 412. In one embodiment, the thickness ratio of the thermal oxide layer 410 and the stacked CVD layer 412 is about 1:0.5 to 1:1.5. The thermal oxide layer 410 is formed by performing a thermal oxidation process, for example, in a furnace. The material of the CVD layer 412 and that of the thermal oxide layer 410 may be the same or different. For example, their materials may include silicon oxide. The stacked CVD layer 412 is constituted with a multiple layer of the CVD layer, for example two or more than two layers. The stacked CVD layer 412 in FIG. 4 is constituted with the CVD layers 412*a*, 412*b*, 412*c*. However, it should not be construed as limiting the scope of the invention. It should be appreciated that, according to practical requirements, the stacked CVD layer 3412 may constitute with two layers or more than three layers of the CVD layer. Each CVD layer 412*a*, 412*b*, 412*c* may form with the same or different methods. For example each CVD layer 412*a*, 412*b*, 412*c* may be a TEOS oxide layer or a HTO layer. The methods in forming the TEOS oxide layer or the HTO layer are described above and will not be reiterated herein. Further, the thicknesses of the deposited layer 412*a*, 412*b*, 412*c* may be the same or different.

Table 1 summarizes the thicknesses of an oxide layer at the center and at the periphery of a wafer, wherein the oxide layer is formed by three different methods. The thicknesses of the oxide layer respectively correspond to the total thickness at the top of the active region and the total thickness at the border of the isolation structure of the center and the periphery of the wafer subsequent to the etching or the cleaning process.

TABLE 1

| | | Wafer Center | | | Wafer Periphery | | |
|---|---|---|---|---|---|---|---|
| Example | Method of forming the oxide layer and the original thickness | Total thickness at the top of the active region | Total thickness at the border of STI | Ratio | Total thickness at the top of the active region | Total thickness at the border of STI | Ratio |
| 1 | Thermal oxide layer 970 angstroms | 852 angstroms | 525 angstroms | 0616 | 871 angstroms | 490 angstroms | 0.563 |
| 2 | Thermal oxide layer 560 angstroms + TEOS layer 500 angstroms | 880 angstroms | 774 angstroms | 0.88 | 856 angstroms | 724 angstroms | 0.846 |
| 3 | Thermal oxide layer 560 angstroms + HTO layer 420 angstroms | 852 angstroms | 772 angstroms | 0.906 | 854 angstroms | 769 angstroms | 0.90 |

In example one, a sole thermal oxide layer formed by the thermal oxidation method is illustrated. Results of example one indicate that, regardless at the center or the periphery of the wafer, variations in the total thickness in the center of the active region and the periphery of the active region (periphery of STI) is high, with a ratio of about 0.56 to 0.61. In examples two and three, a thermal oxide layer is first formed by a thermal oxidation process, followed by forming respectively the TEOS layer and the HTO layer using chemical vapor deposition. The results of examples 2 and 3 indicate that the variations in the thickness between the center and the periphery of the active region at the center or at the peripheral of the wafer significantly reduces, with a ratio of about 0.84 to 0.90. In other words, the method of the present invention provides improvement to the uniformity of the gate dielectric layer.

Accordingly, the gate dielectric layer of the high voltage device of the present invention is formed with a composite material layer. The composite material layer is formed with at least two layers of the continuous layer constituted with a thermal oxide layer and a chemical vapor deposited material layer. The thermal oxide layer has desirable qualities, while the CVD material layer has desirable uniformity. Hence, the thickness of the top edge part of the isolation structure is enhanced to conceal to the top edge part of the isolation structure. Further, the quality of the CVD material layer may be enhanced by the subsequent thermal annealing process. Accordingly, the composite gate dielectric layer of the present invention has good quality and uniformity to improve the breakdown characteristic of the device and to enhance the reliability of the device.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a high voltage device, wherein the method comprises:
    forming two isolation structures in the substrate;
    forming a composite dielectric layer on a substrate, wherein the composite dielectric layer is a combination of at least one thermal oxide layer and at least one chemical vapor deposited layer, the step of forming the composite dielectric layer comprising:
    forming a patterned mask layer on the substrate, wherein the patterned mask layer comprises an opening that exposes the substrate;
    performing a thermal oxidation process to grow the thermal oxide layer on the substrate exposed by the opening;
    performing a chemical vapor deposition process to form a deposited silicon oxide layer on the thermal oxide layer
    forming a gate on the composite dielectric layer after the step of forming the composite dielectric layer; and
    forming a source region and a drain region in the substrate respectively beside two sides of the gate, wherein the chemical vapor deposited layer partially covers the isolation structures after formation of the source region and the drain region.

2. The method of claim 1, wherein subsequent to the step of forming of the chemical vapor deposited layer on the thermal oxide layer, a thermal annealing process is performed.

3. The method of claim 2, wherein the thermal annealing process is performed in a furnace.

4. The method of claim 2, wherein the thermal annealing process is conducted at a temperature of about 1150±50 degrees Celsius.

5. The method of claim 2, wherein the thermal annealing process is conducted for about 30±5 minutes.

6. The method of claim 1, wherein the method of forming the mask layer comprises forming, sequentially from the substrate, a pad oxide layer and a silicon nitride layer.

7. The method of claim 1, wherein the chemical vapor deposited layer comprises a silicon oxide layer formed with tetraethyl orthosilicate (TEOS) as a reactant gas.

8. The method of claim 1, wherein the chemical vapor deposited layer comprises a high temperature oxide layer.

9. The method of claim 1, wherein a ratio of a thickness of the thermal oxide layer to the chemical vapor deposited layer is between about 1:0.5 and about 1:1.5.

10. The method of claim 1, wherein the composite dielectric layer is formed on the substrate between interior sides of the two isolation structures, and the two source/drain regions are respectively formed in the substrate at exterior sides of the two isolation structures.

11. The method of claim 1, wherein the step of forming the composite dielectric layer further comprises:
   forming a single layer of the thermal oxide layer; and
   forming a single layer of the chemical vapor deposited layer on the single layer of the thermal oxide layer.

12. The method of claim 1, wherein the step of forming the composite dielectric layer further comprises:
   forming multiple layers of the thermal oxide layer; and
   forming a single layer of the chemical vapor deposited layer on the multiple layers of the thermal oxide layer.

13. The method of claim 1, wherein the step of forming the composite dielectric layer further comprises:
   forming multiple layers of the thermal oxide layer; and
   forming multiple layers of the chemical vapor deposited layer on the multiple layers of the thermal oxide layer.

14. The method of claim 1, wherein the step of forming the composite dielectric layer further comprises:
   forming a single layer of the thermal oxide layer; and
   forming multiple layers of the chemical vapor deposited layer on the single layer of the thermal oxide layer.

15. The method of claim 1, wherein a ratio of a thickness at a periphery of the composite dielectric layer to a thickness at a center of the composite dielectric layer is from 0.84 to 0.90.

* * * * *